United States Patent [19]

Huizer

[11] Patent Number: 4,691,127
[45] Date of Patent: Sep. 1, 1987

[54] ADAPTIVE ELECTRONIC BUFFER SYSTEM HAVING CONSISTENT OPERATING CHARACTERISTICS

[75] Inventor: Cornelis M. Huizer, Eindhoven, Netherlands

[73] Assignee: U.S. Philips Corporation, New York, N.Y.

[21] Appl. No.: 801,189

[22] Filed: Nov. 25, 1985

[30] Foreign Application Priority Data

Dec. 5, 1984 [NL] Netherlands ............... 8403693

[51] Int. Cl.$^4$ ............... H03K 1/02; H03K 17/30
[52] U.S. Cl. ............... 307/475; 307/297; 307/443; 307/491; 307/591
[58] Field of Search ............... 307/491, 517, 357, 356, 307/247 R, 475, 443, 572, 591, 200 A, 297

[56] References Cited

U.S. PATENT DOCUMENTS 4,224,536 9/1980 Cutsogeorge ............... 307/297
4,584,492 4/1986 Sharp ............... 307/475

FOREIGN PATENT DOCUMENTS 83419 5/1985 Japan ............... 261/18.2

Primary Examiner—Stanley D. Miller
Assistant Examiner—Richard Roseen
Attorney, Agent, or Firm—Robert T. Mayer; Steven R. Biren

[57] ABSTRACT

In an adaptive electronic buffer system in which a set circuit generates logic set signals for the buffer circuits, parallel sub-buffers are switched on or off by the set signals, so that the specified charging and discharging times of the output can be achieved. This setting compensates for the manufacturing process variations and operating conditions (temperature, supply voltage) of the buffer circuits. The spread in the output conductance is reduced, thus reducing the risk of fast current variations, inductive voltage peaks and the associated loss of data.

8 Claims, 3 Drawing Figures

ADAPTIVE ELECTRONIC BUFFER SYSTEM HAVING CONSISTENT OPERATING CHARACTERISTICS

BACKGROUND OF THE INVENTION

An adaptive electronic output buffer system having a set circuit which includes a set output and a buffer circuit which includes a signal input, a signal output and a set input which is connected to the set output, the set circuit generating a set signal on its set output in order to counteract the effects of the manufacturing process variations and operating conditions on the output conductance of the buffer circuit.

The design of a buffer circuit is inter alia aimed at the charging and discharging of a capacitive load on the output within a specified period of time. On the basis of this requirement, a minimum value can be determined as regards the conductance of the buffer output. For the design of a buffer circuit satisfying this requirement as regards the output conductance, it is also necessary to take into account variations in the manufacturing process and the operating conditions (temperature, supply voltage) in which the design is to be used. The design is based on the least favorable combination (the so-called "worst case") of manufacturing process variations and operating conditions. Such a worst case combination will generally not occur in a realized design. The buffer will usually be overproportioned, which means that the output conductance and the output currents will be larger than calculated for the design. Switching operations then give rise to fast current variations (dI/dt) and voltage peaks across the inductances of the supply lines. These pulses reduce the intereference margin in digital circuits and may even cause incorrect switching and hence a loss of information in memory cells.

U.S. Pat. No. 3,970,875 describes a circuit in which an analog control signal sets a buffer in order to compensate for the effect of the process variations and the operating conditions. This circuit controls the charging current on the output of a static dissipating buffer; the discharging current cannot be controlled. Moreover, the extent of the control range can not be selected at random.

SUMMARY OF THE INVENTION

It is an object of the invention to provide an adaptive electronic buffer system in which the buffer is adapted so that the spread in the charging and discharging currents is substantially smaller than the spread to be expected on the basis of the variations in the manufacturing process and the operating conditions of the buffer.

To achieve this, an adaptive electronic buffer system in accordance with the invention is characterized in that the buffer circuit includes at least two sub-buffers which are connected in parallel between the signal input and the signal output, one sub-buffer being a switchable subbuffer which includes an activation input connected to the set input and which is selectively set to one of the extreme states of conductance by a binary set signal generated on the set output of the set circuit.

The use of logic set signals results in a wide control range, because each set signal can correspond to a freely selectable contribution to the total output conductance of the buffer. The buffers include N sub-buffers which are to be connected in parallel and which are activated or not under the control of the set signals; an activated sub-buffer contributes to the output conductance of the buffer. In the case of an integrated buffer circuit composed of sub-buffers, the required surface area and the output capacity are the same as in a buffer whose design is based on the "worst-case" situation.

The set circuit includes a characterization circuit having a measurement conductance which is a characteristic representation of the output conductance adjusted for the buffer circuits. The measurement conductance is compared with a constant reference conductance which is preferably not influenced by the manufacturing process variations and the operating conditions. The results of this comparison are used in a logic circuit in order to generate those set signals for which the output conductance of the buffer is slightly higher than or equal to the target value.

BRIEF DESCRIPTION OF THE DRAWING

Several embodiments in accordance with the invention will be described in detail hereinafter with reference to the drawing; in which.

DESCRIPTION OF THE PREFERRED EMBODIMENTS

Figure 1:
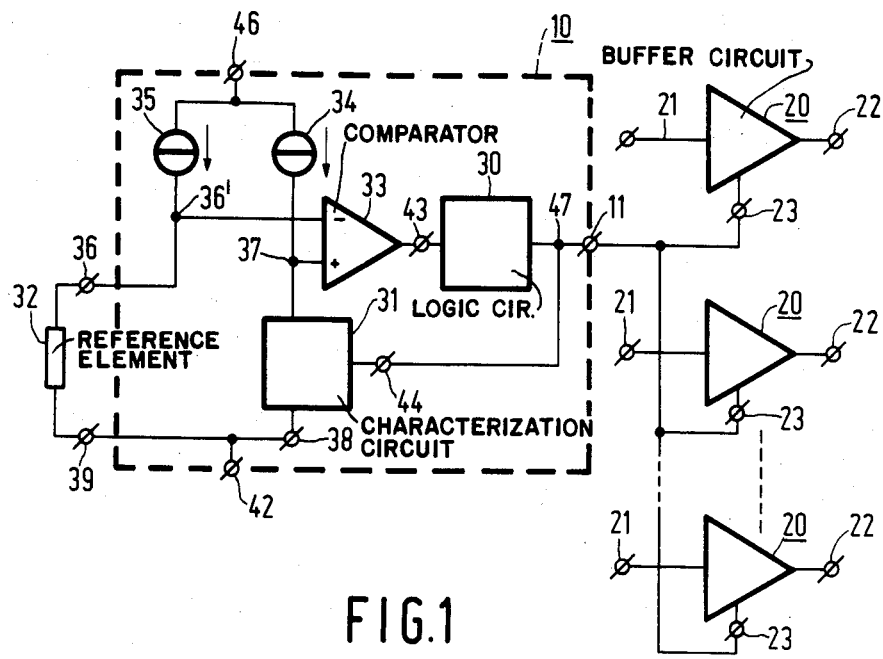
FIG. 1 shows a buffer system in accordance with the invention.

FIG. 1 is a general representation of a buffer system in accordance with the invention. Buffer circuits 20 which include an input (21) and an output (22) are connected, via N (N>1) set signal inputs (23), to N set signal outputs (11) of a set circuit 10. The set circuit 10 includes a logic circuit (30) which includes an input (43) and N outputs (47) which are connected to the set outputs 11. The outputs (11) of the logic circuit 30 are also connected to the N inputs (44) of a characterization circuit (31). The characterization circuit (31) also includes a first (37) and a second (38) measurement connection, the first measurement connection 37 being connected to a first comparison input of a comparator (33) while the second measurement connection is connected to a first supply voltage terminal (42). The set circuit 10 also includes a first (36) and a second (39) reference connection, the first reference connection being connected to a second comparsion input (36') while the second reference connection 39 is connected to the second measurement connection (38). A first (34) and a second (35) current-source are connected, by way of a first connection, to a second supply voltage terminal (46). The first and the second current source are connected, via a second connection, to the first measurement connection (37) and the reference connection (36), respectively. The current-sources apply currents to the first reference connection (36) as well as to the first measurement connection (37), the ratio of the current intensities being constant and defined by the design of the circuit.

The control circuit formed by the logic circuit (30), the comparator (33), a reference element (32) and the characterization circuit (31) generates the set signals for the buffer circuits. These signals are also applied to the inputs of the characterization circuit (31). The measurement conductance between the first (37) and the second (38) measurement connection is a characteristic representation of the output conductance adjusted for the buffer circuits, said measurement conductance being dependent on the set signals, process variations and operating conditions to the same extent as the output conductance of the buffer circuits.

The reference element (32) which should have a constant, properly defined conductance which is independent of the operating conditions is connected between the first (36) and the second (39) reference connection. When the buffer system is used in an integrated circuit, it is advantageous to construct the reference element as an external resistor which is independent of the manufacture of and the operating conditions on the chip. This resistor can be included in a reset circuit on the integrated circuit which is often already present anyway, so that no additional input will be required for the reference element. It is alternatively possible to integrate the reference element in the circuit in the form of a switched capacitor (as described in Philips Technisch Tijdschrift 1983, No. 4, pages 115 and 116). This offers the advangage that no additional components are required; however, it is a drawback that the reference conductance is not completely independent of the process variations. It has been found that a spread of approximately 10 percent must be taken into account which, however, is still substantially less than the spread in the output conductance. It will be apparent that use can also be made of a reference element in the form of an integrated resistor. In that case it must be ensured that the resistor is sufficiently independent of the process variations and the operating conditions.

The comparator (33) compares the voltages generated by the currents through the measurement conductance and the reference conductance (32). The output signal of the comparator serves as an input signal for the logic circuit (30). On its outputs (47) this circuit generates the set signals, ensuring that the measurement conductance better approximates the reference conductance. The control circuit is in equilibrium when the voltage across the measurement conductance is slightly lower than or equal to the voltage across the reference conductance.

In order to prevent a continuous variation of the output conductance of the buffer circuits, the search for the best setting should be performed with suitable intervals of, for example from 0.1 to 1 second, and some hysteresis can be introduced in the transfer function of the comparator. To this end, the comparator may include a so-called Schmitt-trigger circuit. In this way the setting is found for which the output conductance of the buffer circuit is slightly higher than or equal to the value determined during design. The spread in the charging and discharging currents on the output of the buffer circuits will thus be substantially smaller than the spread caused by the process variations and operating conditions.

Many embodiments of the logic circuit (30) are feasible. In one embodiment, it comprises a binary up/down counter whose counting direction is determined by the result of said comparison. The outputs of the counter form the set signals.

The embodiments of the buffer circuits and the characterization circuit are closely interwoven.

Figure 2:
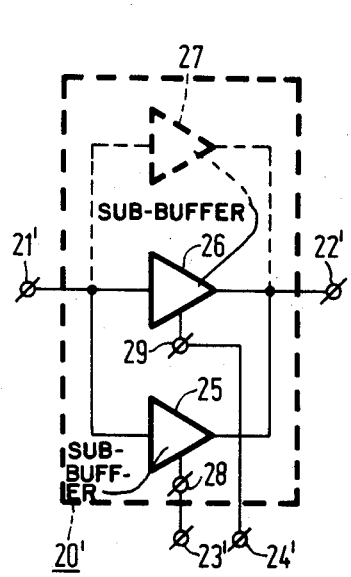
FIG. 2 shows a buffer circuit.

FIG. 2 shows a buffer circuit (20′) in accordance with the invention which includes an input (21′), an output (22′) and a first (23′) and a second (24′) set input (N=2). The circuit includes a first (25) and a second (26) switchable sub-buffer, each of which includes an activation input (28, 29, respectively) which is connected to the first (23′) and the second (24′) set input, respectively.

The buffer may also include a non-switchable sub-buffer (27) which is always active and which includes an input and an output. The junction of all inputs of the sub-buffers constitutes the input and the junction of all outputs of the sub-buffers constitutes the output of the buffer circuit. The switchable sub-buffers are switched on or off by the set signal on their activation input.

Figure 3:
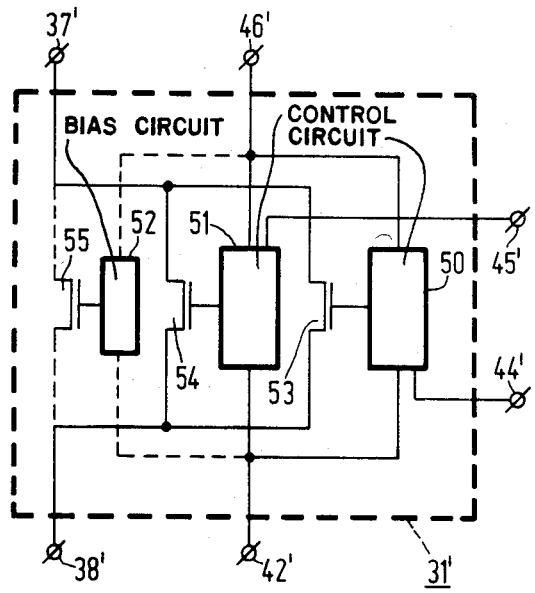
FIG. 3 shows a characterization circuit.

FIG. 3 shows an embodiment of a characterization circuit for the desired buffer circuit. The characterization circuit (31′) includes a first (44′) and a second (45′) input (N=2), a connection terminal for a first (42′) and a second (46′) supply voltage, and a first (37′) and a second (38′) measurement connection. The circuit also includes a first (50) and a second (51) control circuit which includes an input (44′, 45′, respectively) and an output whereto a first (53) and a second (54) measurement element, respectively, is connected. The two control circuits also include a connection to the first (42′) and the second (46′) supply voltage terminal. In the present embodiment the measurement elements are constructed as isolated gate field effect transistors (IGFET), the channel being connected at one end to the first measurement connection (37′) and to the second measurement connection (38′) at the other end; the gate is connected to the output of the associated control circuit.

When the buffer circuits include a non-switchable switchable sub-buffer, the characterization circuit comprises a bias circuit (52) which includes a third measurement element (55). The latter combination is connected in the same way as the described control circuit/measurement element combinations, a difference being that the bias circuit does not include an input and that the third measurement element is continuously switched on. The channel lengths of the measurement elements correspond to the channel lengths of the field effect transistors (IGFET) in the sub-buffers charcterized thereby, because the spread in the conductance depends on these lengths to a high degree. The ratios of the conductance factors of the field effect transistors are chosen to be equal to the ratios of the output conductances of the sub-buffers characterized thereby.

An activated measurement element (IGFET) receives the mean value of the voltages on the two supply voltage terminals on its gate, so that the FET obtains a characteristic setting and the conductance of the channel becomes co-dependent on the supply voltages. The temperature of the field effect transistors preferably equals that of the buffer circuit. In the case of an integrated circuit application, the process variations determining the properties of the buffer circuits are equal to the variations determining the properties of the measurement elements. These circumstances ensure that the measurement conductance will be a characteristic representation of the output conductance of the buffer circuits.

The switchable sub-buffers may be constructed as so-called tri-state buffers, for example as the known integrated circuit HEF 40098B. If desired, the set signal inputs can also be used to switch the output of a buffer circuit to the high impedance state.

The following example illustrates the results achieved by using a buffer system in accordance with the invention. Let us assume that the output conductance exhibits a spread factor 4 (a practical value in integrated circuits) and that use is made of an embodiment including two switchable sub-buffers (N=2). The "worst case" circumstances determine the total buffer capacity. This capacity is distributed that the distribution is optimum when the first sub-buffer has a capacity amounting to 0.39 times the total capacity and the second buffer a capacity of 0.61 times the total capacity. The buffer circuit is then at the most 1.6 times overproportioned, which results in a gain of 2.5 times. When the output conductance is higher than desired, the conductance of the elements controlling the buffers in an integrated circuit will also be higher. The buffers are thus driven faster, and hence supply a larger current. Simulations have revealed that a square-law relationship exists between the fast current variations (dI/dt) and the output conductance. It is advisable to also include the circuit driving the buffers in the system in accordance with the invention. The gain obtained for the fast current variations is then substantially higher.

What is claimed is:

1. An adaptive electronic output buffer system, which comprises:
   a set circuit having a set output, said set circuit in operation generating a binary set signal at said output;
   a buffer circuit having a signal input, a signal output and a set input which is connected to the set output of the set circuit, said buffer circuit comprising at least two sub-buffers which are connected in parallel between the signal input and the signal output, one of said sub-buffers being a switchable sub-buffer having an activation input connected to the set input and which is selectively set in operation to one of the states of maximum and minimum conductance by said binary set signal at said set output, the set signal at said set output in operation counteracting the effects of manufacturing process variations and operating conditions on the output conductance of the buffer circuit;
   a characterization circuit in said set circuit having N inputs, first and second measurement connections, and first and second reference connections, the inputs of the characterization circuit being connected to the set output;
   a measurement conductance provided between said first and second measurement connections for providing a measure of the output conductance of said buffer circuit; and
   a reference element having a constant conductance connected to said first and second reference connections, said reference element comprising a resistor.

2. An adaptive electronic buffer system as claimed in claim 1, characterized in that the buffer circuit includes N (N≧1) set inputs and N switchable sub-buffers, the set circuit including N set outputs, each switchable sub-buffer receiving, via its own set input, the binary set signal from its own set output.

3. An adaptive electronic buffer system as claimed in claim 2, characterized in that the buffer system includes several buffer circuits.

4. An adaptive electronic buffer system as claimed in claim 1, characterized in that the reference element comprises a switched capacitance.

5. An adaptive electronic buffer system as claimed in claim 1, characterized in that the set circuit includes a control circuit which is formed by a logic circuit which includes an input and N outputs, by the characterization circuit, by the reference element and by a comparator which includes a first and a second comparator input and an output, the first measurement connection being connected to the first comparator input while the first reference connection is connected to the second compartor input, the output of the comparator being connected to the input of the logic circuit, the second measurement connection and the second reference connection also being interconnected, current sources connected to the first and the second comparator input applying currents with a constant ratio to the first measurement connection as well as to the first reference connection.

6. An adaptive electronic buffer system as claimed in claim 5, characterized in that the characterization circuit includes N parallel switchable measurement elements, each measurement element making a contribution to the total measurement conductance under the control of a given set signal, which contribution characterizes the contribution made to the total output conductance of its buffer circuit made by each switchable subbuffer controlled by the same set signal.

7. An adaptive electronic buffer system as claimed in claim 6, characterized in that the characterization circuit includes connections to a first and a second supply voltage terminal, each voltage terminal having a voltage thereon, the measurement elements including isolated gate field effect transistors, a first end of a channel of the transistor being connected to the first measurement connection while a second end of the channel is connected to the second measurement connection, conductances of the channels serving as the output conductances of the sub-buffers characterized thereby, a gate of a conductive measurement element receiving a control voltage which is equal to the mean value of the voltages on the two supply voltage terminals.

8. An adaptive electronic buffer system as claimed in claim 6, characterized in that the length of the channels of the field effect transistors in the measurement elements equals the length of the field effect transistors in the sub-buffers characterized thereby.

* * * * *